United States Patent
Iwadate

(10) Patent No.: US 7,759,936 B2
(45) Date of Patent: Jul. 20, 2010

(54) RF COIL AND MAGNETIC RESONANCE IMAGING APPARATUS

(75) Inventor: Yuji Iwadate, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 239 days.

(21) Appl. No.: 12/051,936

(22) Filed: Mar. 20, 2008

(65) Prior Publication Data
US 2008/0231279 A1    Sep. 25, 2008

(30) Foreign Application Priority Data
Mar. 23, 2007    (JP)    ............... 2007-077514

(51) Int. Cl.
*G01V 3/00*    (2006.01)
(52) U.S. Cl. ...................... 324/318; 324/322
(58) Field of Classification Search ......... 324/300–322; 600/407–445; 335/219; 333/299
See application file for complete search history.

(56) References Cited

U.S. PATENT DOCUMENTS

| | | | |
|---|---|---|---|
| 4,728,896 A | 3/1988 | Bendall et al. | |
| 4,777,438 A | 10/1988 | Holland | |
| 4,825,162 A | 4/1989 | Roemer et al. | |
| 4,879,516 A | 11/1989 | Mehdizadeh et al. | |
| 5,030,915 A | 7/1991 | Boskamp et al. | |
| 5,329,233 A | 7/1994 | Hayes | |
| 5,500,596 A | 3/1996 | Grist et al. | |
| 5,786,692 A * | 7/1998 | Maier et al. | ............... 324/307 |
| 6,097,186 A | 8/2000 | Nabetani | |
| 2008/0306377 A1 * | 12/2008 | Piron et al. | ............... 600/422 |

FOREIGN PATENT DOCUMENTS

| | | |
|---|---|---|
| JP | 11-318851 | 11/1999 |
| JP | 2001-327477 | 11/2001 |

* cited by examiner

*Primary Examiner*—Brij B Shrivastav
(74) *Attorney, Agent, or Firm*—Armstrong Teasdale LLP

(57) ABSTRACT

An RF coil includes a first loop coil element including a first plane closed by a first coil line and a second loop coil element including a second plane, wherein the first loop coil element and the second loop coil element move while maintaining a facing state to vary the square measure of a facing area in which the first coil plane and the second coil plane face each other. The first loop coil element includes a first spreading part having a first coil line disposed such that a distance of opposing by the first coil line parallel to a first moving direction widens in the first moving direction, in a direction normal to the first moving direction in which the movement takes place such that the square measure of the facing area increases relative to the second loop coil element in a direction parallel to the first plane.

20 Claims, 12 Drawing Sheets

Section A

Section B

RF COIL AND MAGNETIC RESONANCE IMAGING APPARATUS

CROSS REFERENCE TO RELATED APPLICATIONS

This application claims the benefit of Japanese Patent Application No. 2007-077514 filed Mar. 23, 2007, which is hereby incorporated by reference in its entirety.

BACKGROUND OF THE INVENTION

The field of the present invention relates to a radio frequency (RF) coil and a magnetic resonance imaging apparatus using this RF coil.

A magnetic resonance imaging apparatus is an apparatus that generates magnetic resonance signals by utilizing the magnetic resonance phenomenon and obtains tomograms of a subject. A magnetic resonance imaging apparatus uses an RF coil for transmitting and receiving magnetic resonance signals. This RF coil is required to have a high signal to noise ratio (SNR) because it handles very weak signals.

In order to realize a high SNR, a small looped coil is used to enhance the sensitivity of the coil. However, a shrunken square measure makes it impossible to image a large area in one shot. For this reason, in order to enhance the sensitivity and at the same time to image a large area in one shot, a plurality of coil elements are arranged to constitute one RF coil, and the plurality of coil elements are used simultaneously. However, the simultaneous use of a plurality of coil elements gives rise to interference mainly by electromagnetic inductance among the coil elements. Known techniques to eliminate or reduce this interference include the following.

One of known such methods is to form an RF coil by arranging a plurality of coil elements in a partly overlapping way. FIG. 12 shows an example of RF coil 1. The RF coil 1 consists of an array of four loop-type coil elements 2. The RF coil 1 can obtain an image of a large area while keeping a level of sensitivity comparable to that of a small looped coil. By appropriately selecting the proportion of overlapping areas between adjoining coil elements, electromagnetic interference can be eliminated (see, for example, Japanese Unexamined Patent Publication No. Hei 11 (1999)-318851).

There is another method which uses a neutralizing circuit formed of a condenser bridge. This neutralizing circuit spans two coil elements by a condenser bridge, which supplies a voltage reverse in phase to an induced electromotive force generated by mutual inductance and thereby cancels electromagnetic interference (see, for example, Japanese Unexamined Patent Publication No. Hei 8 (1996)-229019).

There further is a method that uses a preamplifier of a low input impedance. By this method, an inductance linking the low-input impedance preamplifier and an RF coil and an output capacitor of the RF coil reduce the current of a Larmor frequency and can thereby reduce mutual inductance between the coil elements (see, for example, Japanese Unexamined Patent Publication No. 2001-327477).

However, the methods described above involve the following problems.

By the method of forming an RF coil by arranging a plurality of coil elements in a partly overlapping way, electromagnetic interference can be eliminated by appropriately selecting the overlapping areas between adjoining coil elements, but varying the overlapping areas between coil elements would give rise to electromagnetic interference. Therefore by this method, if the size of the RF coil is varied to match the region or the bodily shape of the subject to be imaged, the overlapping areas between coil elements will vary, resulting in coupling of the coil elements and a drop in SNR. If the RF coil is used without varying its size and the subject is small, the distance between the RF coil and the subject will become too large, inviting a drop in SNR and deterioration in the picture quality of the obtained image. If the subject is large, the imaging area in which the RF coil can shoot the subject will shrink, resulting in an increased number of required times of imaging.

Further, by the method which uses a neutralizing circuit formed of a condenser bridge, the need for the neutralizing circuit means a higher cost. Further, if the size of the RF coil is increased to obtain a wide diagnostic image in one shot, the number of coil elements constituting the RF coil will increase, and the increase in the number of coil elements will invite correspondingly more complex wiring.

Further, by the method using a preamplifier of low input impedance, the low-input impedance preamplifier means an extra cost as does the neutralizing circuit. Moreover, where the magnetic interference between coil elements is intense, the eliminating function may not prove sufficient.

SUMMARY OF THE INVENTION

It is desirable that problems described previously are solved.

An RF coil according to the invention of a first aspect has a first loop coil element including a first plane closed by a first coil line and a second loop coil element including a second plane closed by a second coil line, in which part of the first plane and part of the second plane face each other, wherein: the first loop coil element and the second loop coil element so move while maintaining the facing state as to vary the square measure of the facing area in which the first coil plane and the second coil plane face each other; the first loop coil element has a first spreading part having a first coil line so disposed that the distance of opposing by the first coil line parallel to a first moving direction widens in the first moving direction in a direction normal to the first moving direction in which the movement so takes place that the square measure of the facing area increases relative to the second loop coil element in a direction parallel to the first plane, and a first coil crossing part in which a first coil line is so disposed as to cross a second spreading part in an arrangement in which the first loop coil element and the second loop coil element are electromagnetically decoupled and the square measure of the facing area is at the minimum thereof; the second loop coil element has a second spreading part having a second coil line so disposed that the distance of opposing by the second coil line parallel to a second moving direction widens in the second moving direction in a direction normal to the second moving direction in which the movement so takes place that the square measure of the facing area increases relative to the first loop coil element in a direction parallel to the second plane, and a second coil crossing part in which a second coil line is so disposed as to cross the first spreading part in the arrangement; and the first loop coil element and the second loop coil element are so formed that, when in the arrangement the facing area has been separated into a first facing area and a second facing area by a line linking a point at which the first spreading part and the second coil crossing part cross each other and a point at which the second spreading part and the first coil crossing part cross each other, the square measure of the second facing area decreases as movement takes place to increase the square measure of the first facing area.

Preferably, the range in which the first loop coil element moves relative to the second loop coil element may be a range in which the first loop coil element and the second loop coil element maintain a decoupled state electromagnetically.

Preferably, the first loop coil element may have a first extending part extending from an end on the side where the first coil line begins to widen outward in the first spreading part; and the second loop coil element has a second extending part extending from an end on the side where the second coil line begins to widen outward in the second spreading part.

Preferably, the first extending part extends in the direction opposite to the first moving direction, and the second extending part extends in the direction opposite to the second moving direction.

Preferably, the first loop coil element may have: a parallel part so extending in a direction parallel to the first moving direction from an end part on the side where the first coil line begins to narrow inward in the first spreading part as to join an end part of the first coil crossing part; and another parallel part extending in a direction parallel to the first moving direction from an end part different from the end part of the first coil crossing part in a direction opposite to the first moving direction, and the second loop coil element may have: a parallel part so extending in a direction parallel to the second moving direction from an end part on the side where the second coil line begins to narrow inward in the second spreading part as to join an end part of the second coil crossing part; and another parallel part extending in a direction parallel to the second moving direction from an end part different from the end part of the second coil crossing part in a direction opposite to the second moving direction.

Preferably, at least one of the first loop coil element and the second loop coil element may be axially symmetric with respect to the first moving direction.

Preferably, at least one of the first loop coil element and the second loop coil element may be axially symmetric with respect to a direction normal to the first moving direction.

Preferably, the shape of the first loop coil element and the shape of the second loop coil element may differ from each other.

Preferably, the shape of the first loop coil element and the shape of the second loop coil element may be the same.

Preferably the RF coil, in a magnetic resonance imaging apparatus which obtains an image of a subject on the basis of magnetic resonance signals deriving from the subject in a magnetostatic space, may take charge of at least one of transmission and reception of the magnetic resonance signals.

A magnetic resonance imaging apparatus according to the invention of a second aspect is a magnetic resonance imaging apparatus having an RF coil which takes charge of at least one of transmission and reception of the magnetic resonance signals, the RF coil having: a first loop coil element including a first plane closed by a first coil line and a second loop coil element including a second plane closed by a second coil line, wherein: part of the first plane and part of the second plane face each other; the first loop coil element and the second loop coil element so move, while maintaining the facing state, as to vary the square measure of the facing area in which the first coil plane and the second coil plane face each other; the first loop coil element has a first spreading part having a first coil line so disposed that the distance of opposing by the first coil line parallel to a first moving direction widens in the first moving direction, in a direction normal to the first moving direction in which the movement so takes place that the square measure of the facing area increases relative to the second loop coil element, in a direction parallel to the first plane, and a first coil crossing part in which a first coil line is so disposed as to cross a second spreading part, in an arrangement in which the first loop coil element and the second loop coil element are electromagnetically decoupled and the square measure of the facing area is at the minimum thereof; the second loop coil element has a second spreading part having a second coil line so disposed that the distance of opposing by the second coil line parallel to a second moving direction widens in the second moving direction, in a direction normal to the second moving direction in which the movement so takes place that the square measure of the facing area increases relative to the first loop coil element, in a direction parallel to the second plane, and a second coil crossing part in which a second coil line is so disposed as to cross the first spreading part in the arrangement; and the first loop coil element and the second loop coil element are so formed that, when in the arrangement the facing area has been separated into a first facing area and a second facing area by a line linking a point at which the first spreading part and the second coil crossing part cross each other and a point at which the second spreading part and the first coil crossing part cross each other, the square measure of the second facing area decreases as movement takes place to increase the square measure of the first facing area.

Preferably, the range in which the first loop coil element moves relative to the second loop coil element may be a range in which the first loop coil element and the second loop coil element maintain a decoupled state electromagnetically.

Preferably, the first loop coil element may have a first extending part extending from an end on the side where the first coil line begins to widen outward in the first spreading part; and the second loop coil element has a second extending part extending from an end on the side where the second coil line begins to widen outward in the second spreading part.

Preferably, the first extending part extends in the direction opposite to the first moving direction, and the second extending part extends in the direction opposite to the second moving direction.

Preferably, the first loop coil element may have: a parallel part so extending in a direction parallel to the first moving direction from an end part on the side where the first coil line begins to narrow inward in the first spreading part as to join an end part of the first coil crossing part; and another parallel part extending in a direction parallel to the first moving direction from an end part different from the end part of the first coil crossing part in a direction opposite to the first moving direction, and the second loop coil element may have: a parallel part so extending in a direction parallel to the second moving direction from an end part on the side where the second coil line begins to narrow inward in the second spreading part as to join an end part of the second coil crossing part; and another parallel part extending in a direction parallel to the second moving direction from an end part different from the end part of the second coil crossing part in a direction opposite to the second moving direction.

Preferably, at least one of the first loop coil element and the second loop coil element may be axially symmetric with respect to the first moving direction.

Preferably, at least one of the first loop coil element and the second loop coil element may be axially symmetric with respect to a direction normal to the first moving direction.

Preferably, the shape of the first loop coil element and the shape of the second loop coil element in the RF coil may differ from each other.

Preferably, the shape of the first loop coil element and the shape of the second loop coil element in the RF coil are the same.

According to the invention, it is possible to provide an RF coil and a magnetic resonance imaging apparatus which can achieve a high SNR even if the overlapping areas between a plurality of coil elements is varied, namely if the size of the RF coil is varied.

Further objects and advantages of the present invention will be apparent from the following description of the preferred embodiments of the invention as illustrated in the accompanying drawings.

DETAILED DESCRIPTION OF THE INVENTION

Exemplary modes for implementing the invention will be described below with reference to drawings.

Figure 1:
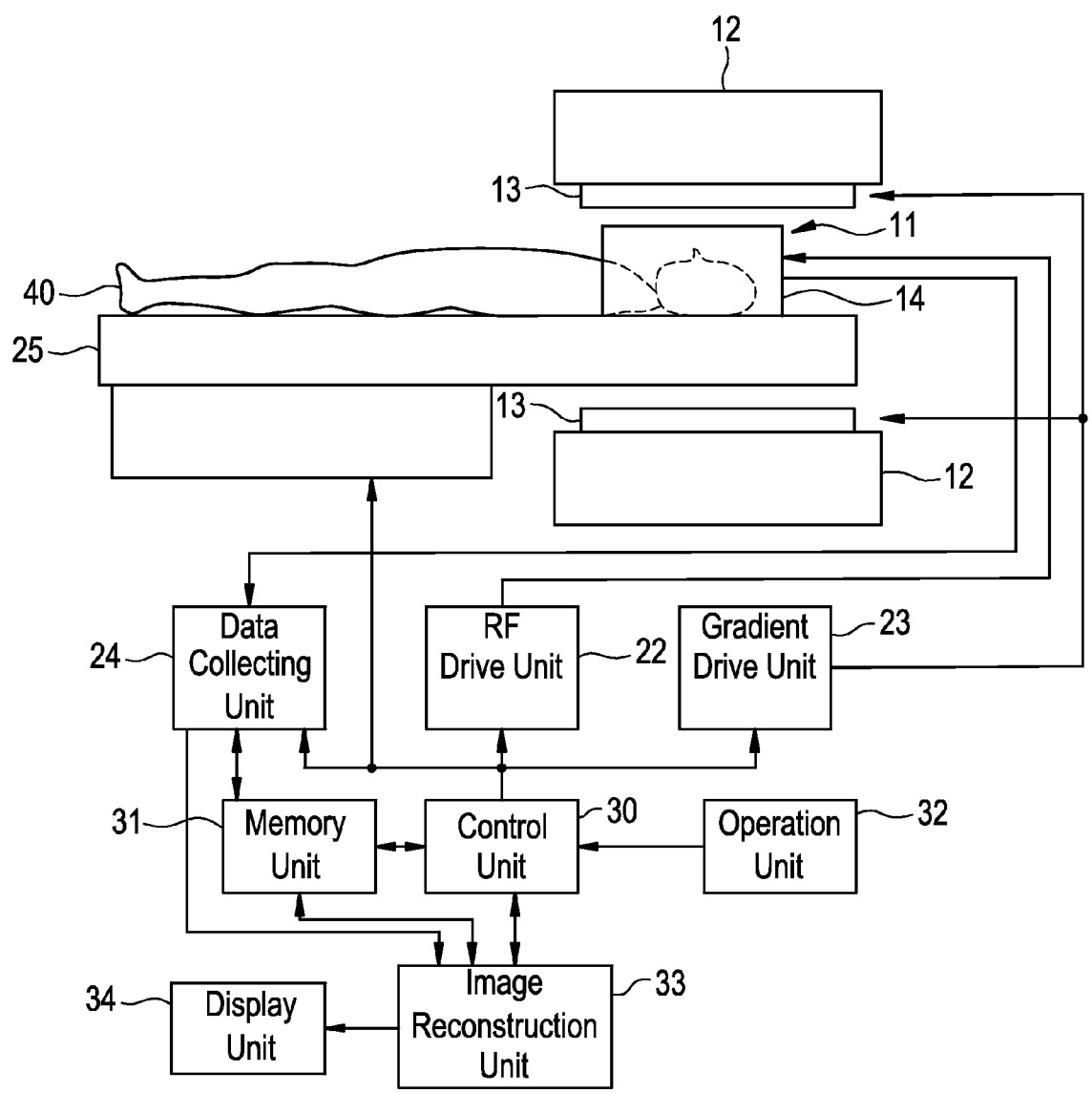
FIG. 1 is a diagram showing the configuration of a magnetic resonance imaging apparatus including an RF coil unit 14 in a first mode for implementing the invention.

FIG. 1 is a diagram showing the configuration of a magnetic resonance imaging apparatus including an RF coil unit in a first mode for implementing the invention. This apparatus is one example of mode for implementing the invention.

As shown in FIG. 1, a magnetic resonance imaging apparatus 10 has a magnetostatic magnet unit 12, a gradient coil unit 13, an RF coil unit 14, an RF drive unit 22, a gradient drive unit 23, a data collecting unit 24, a subject carrying unit 25, a control unit 30, a memory unit 31, an operation unit 32, an image reconstruction unit 33 and a display unit 34.

The individual elements will be successively described below.

The magnetostatic magnet unit 12 is provided to form a magnetostatic field in a magnetostatic space 11 in which a subject is to be accommodated. The magnetostatic magnet unit 12 has an open type configuration in which, for instance, a pair of permanent magnets are so arranged as to sandwich the magnetostatic space 11 between them and the direction of the magnetostatic field is normal to the body axis of a subject 40. Incidentally, though not shown in FIG. 1, the magnetostatic magnet unit has an upper yoke, a lower yoke and a side yoke, and the ends of the upper yoke and of the lower yoke are supported by the side yoke. One each of the paired permanent magnets is arranged in the upper yoke and the lower yoke.

The gradient coil unit 13 generates gradient magnetic fields in the magnetostatic space 11 to provide three-dimensional positional information to the magnetic resonance signals received by the RF coil unit 14. The gradient coil unit 13 has three gradient coils to generate three different gradient magnetic fields including a slice selecting gradient magnetic field, a reading gradient magnetic field and a phase encoding gradient magnetic field.

The RF coil unit 14 includes coil elements 15 (see FIG. 2 and the following drawings) to be described afterwards. The RF coil unit 14 so arranged, for instance, as to surround the whole head that is the imaging region of the subject 40, is configured as a reception coil for receiving magnetic resonance signals from the subject. The RF coil unit 14 transmits RF signals, which constitute an electromagnetic wave, to the subject in the magnetostatic space 11 to generate a high frequency magnetic field, and excites proton spins in the imaging area of the subject 40. Then, the RF coil unit 14 receives as magnetic resonance signals the electromagnetic wave generated from the protons. Incidentally, the RF coil unit 14 may also be so configured as to serve both transmission and reception purposes.

The RF drive unit 22 has a gate modulator (not shown), an RF power amplifier (not shown) and an RF oscillator (not shown) to drive the RF coil unit 14 to generate a high frequency magnetic field in the magnetostatic space 11. The RF drive unit 22, in accordance with a control signal from the control unit 30, modulates RF signals from the RF oscillator into signals of a prescribed timing and a prescribed envelope by using the gate modulator. Then, after amplifying with the RF power amplifier the RF signals modulated by the gate modulator, it outputs the signals to the RF coil unit 14.

The gradient drive unit 23, in accordance with a control signal from the control unit 30, drives the gradient coil unit 13 to generate a gradient magnetic field in the magnetostatic space 11. The gradient drive unit 23 also has three drive circuits (not shown) matching the three gradient coils of the gradient coil unit 13.

The data collecting unit 24, in order to collect the magnetic resonance signals received by the RF coil unit 14, has a phase detector (not shown) and an analog-to-digital converter (not shown). The data collecting unit 24 subjects the magnetic resonance signals from the RF coil unit 14 to phase detection by the phase detector with the output of the RF oscillator of the RF drive unit 22 as the reference signal, and outputs the detected signals to the analog-to-digital converter. It then causes the analog-to-digital converter to convert the magnetic resonance signals having undergone phase detection by the phase detector, which are analog signals, into digital signals and outputs the converted signals to the image reconstruction unit 33.

The subject carrying unit 25 has a table for mounting the subject 40 thereon. The subject carrying unit 25, in accordance with a control signal from the control unit 30, moves the table-mounted subject 40 between the inside and outside of the magnetostatic space 11.

The control unit 30 has a computer and a program which, using the computer, causes various units to execute operations matching a prescribed scan. The control unit 30 is connected to the operation unit 32, processes operation signals inputted to the operation unit 32, and outputs control signals to the RF drive unit 22, the gradient drive unit 23, the data collecting unit 24, and the subject carrying unit 25 to control them. The control unit 30, in accordance with an operation signal from the operation unit 32, controls the image reconstruction unit 33 to obtain a desired image.

The memory unit 31 is configured of a computer. The memory unit 31 stores magnetic resonance signals collected by the data collecting unit 24 and not yet been subjected to image reconstruction, and image data resulting from image reconstruction by the image reconstruction unit 33.

The operation unit 32 includes operation devices including a keyboard and a mouse, and outputs to the control unit 30 operation signals corresponding to the operator's actions.

The image reconstruction unit 33 is configured of a computer. The image reconstruction unit 33 is connected to the data collecting unit 24 and subjects magnetic resonance signals outputted from the data collecting unit 24 to image reconstruction to obtain images.

The display unit 34, configured of a display device such as a display, displays images of the subject 40 obtained by the image reconstruction unit 33.

Next, details of the RF coil unit 14 mentioned above will be described.

Figure 2:
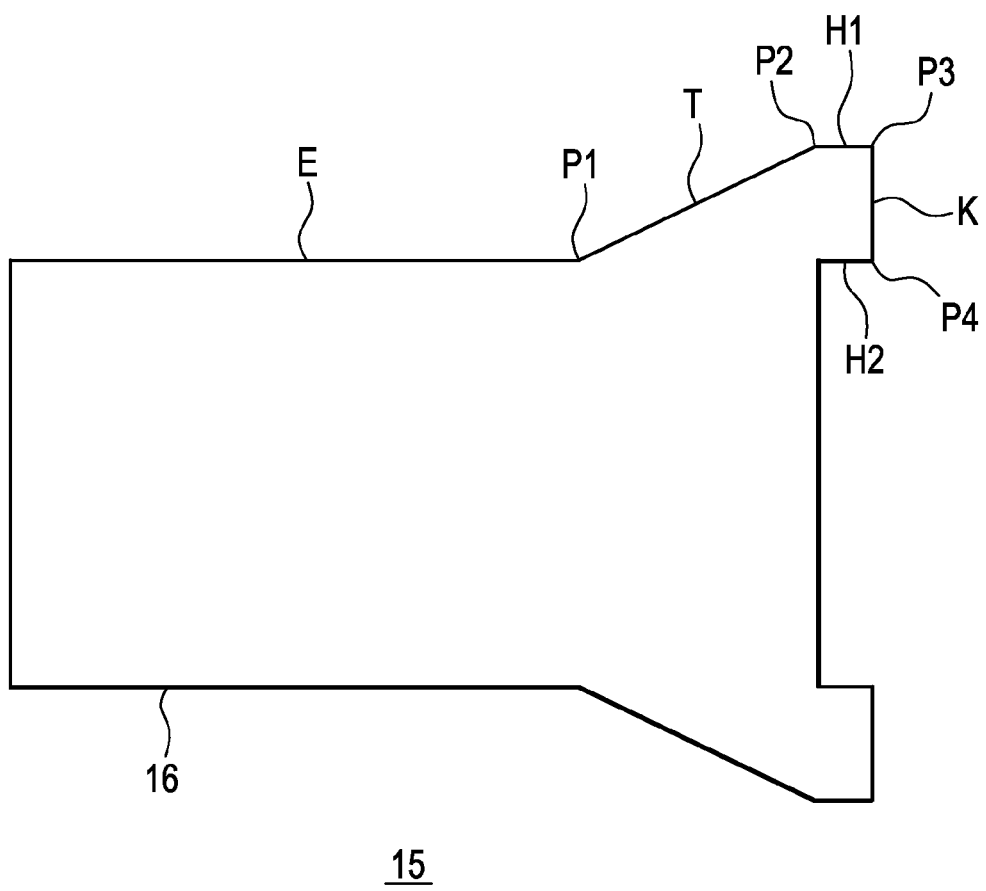
FIG. 2 shows the shape of a coil element constituting the RF coil unit in a mode for implementing the invention.
Figure 2:
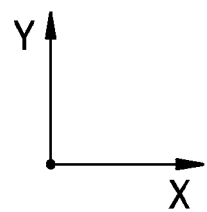
Figure 3A:
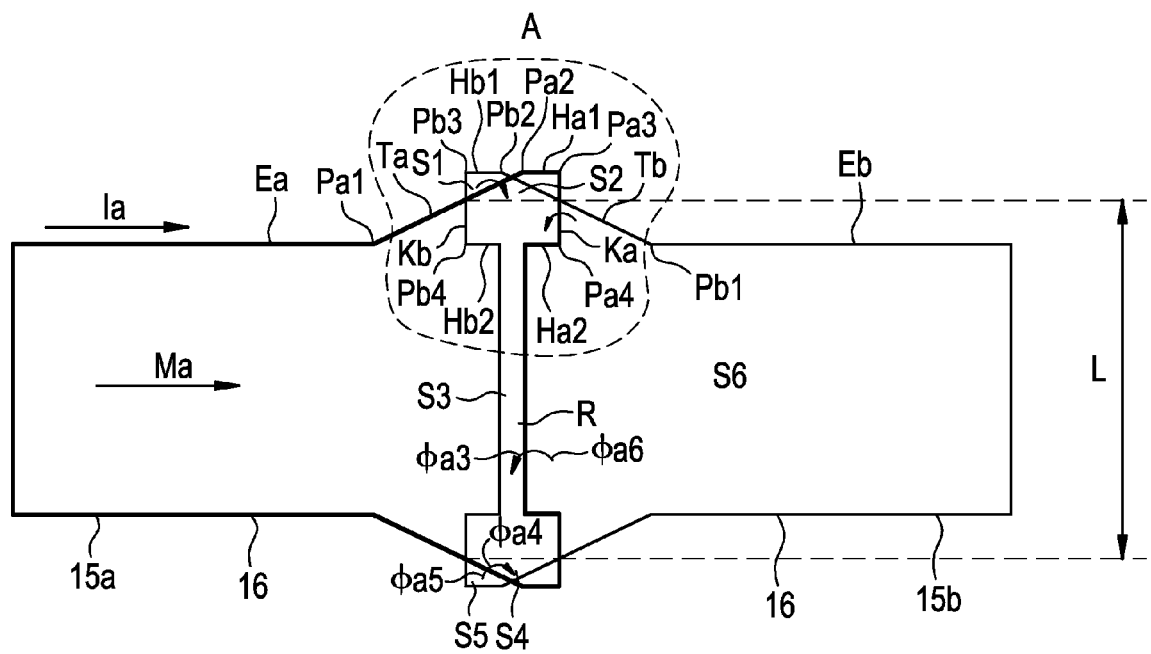
FIGS. 3(a) and 3(b) show a state in which the coil elements in a mode for implementing the invention overlap each other.
Figure 3B:
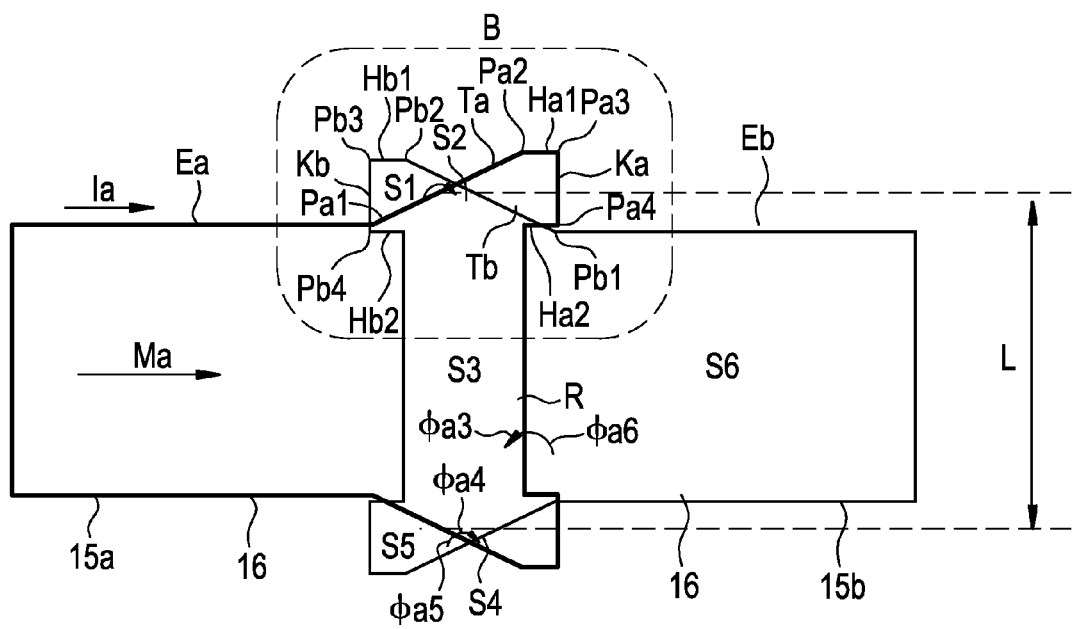
Figure 4A:
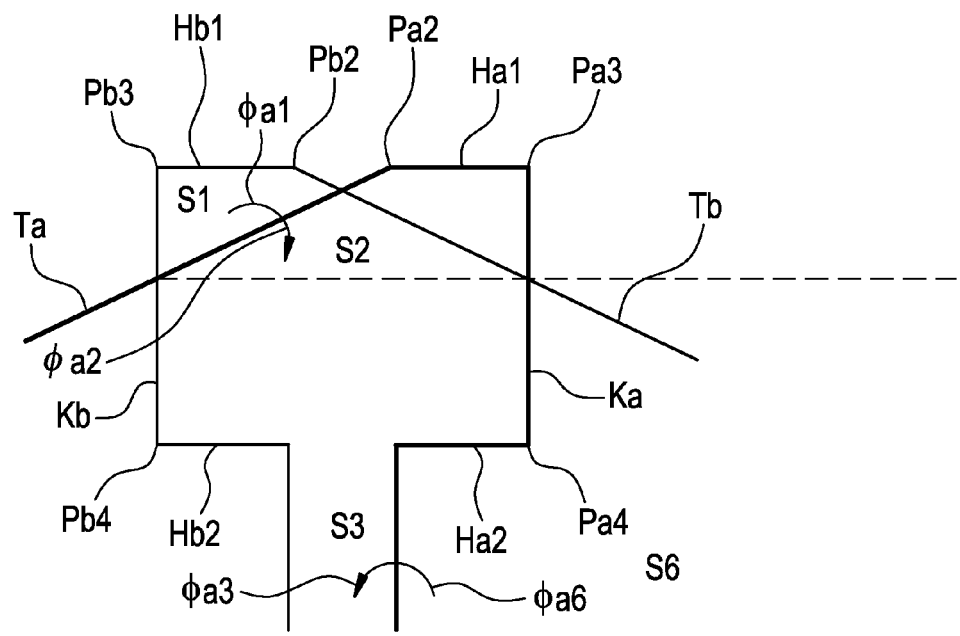
FIGS. 4(a) and 4(b) show enlarged views of part A and part B surrounded by broken lines in FIGS. 3(a) and 3(b), respectively.
Figure 4B:
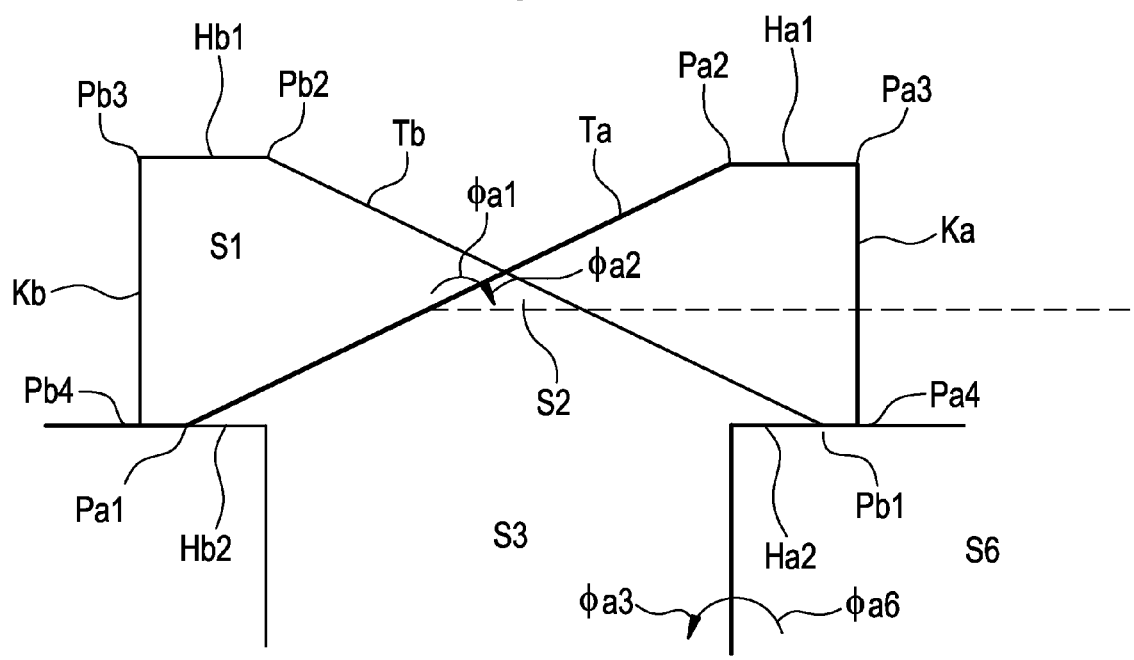

FIG. 2 shows the shape of a coil element constituting part of the RF coil unit in a mode for implementing the invention. This coil element is one example of mode for implementing the invention. FIGS. 3(a) and 3(b) show a state in which the coil elements in a mode for implementing the invention overlap each other. The shape and overlapping of coil elements in this mode for implementation is one example of mode for implementing the invention. FIGS. 4(a) and 4(b) show enlarged views of part A and part B surrounded by broken lines in FIGS. 3(a) and 3(b).

As shown in FIG. 2, in a coil element 15 constituting part of the RF coil unit 14, a coil line 16 is formed in a loop shape. The coil element 15 has a spreading part T in which the distance between parts of the coil line 16 opposing in the Y-axis direction widens in the X-axis direction, an extending part E which extends in parallel to the X-axis and crosses the spreading part T at a vertex P1, a parallel part H1 which extends in parallel to the X-axis and crosses the spreading part T at a vertex P2, a coil crossing part K which extends in parallel to the Y-axis and crosses the parallel part H1 at a vertex P3, and a parallel part H2 which extends in parallel to the X-axis and crosses the coil crossing part K at a vertex P4. The coil element 15 has a shape axially symmetric with respect to the X-axis direction. The angle of the spreading part T to the parallel part H1 and the length of the spreading part T are optimally determined by the shape and size of the coil element 15. In the RF coil unit 14, as shown in FIG. 3(a) for instance, a first coil element 15a and a second coil element 15b overlap each other. The part where the coil elements 15 come into contact with each other are electrically insulated.

Referring to FIG. 3(a), the first coil element 15a can be moved in the Ma direction relative to the second coil element 15b to make the size of the RF coil unit 14 smaller, and can also be moved opposite to the Ma direction to make the size of the RF coil unit 14 larger. The size of the RF coil unit 14 is adjusted by moving the first coil element 15a.

The current flowing through the first coil element 15a is represented by Ia; the direction in which the current flows, by the arrow; a magnetic flux formed by the first coil element 15a, by φa; and the direction of the magnetic flux φa, by the arrow crossing the first coil element 15a or the second coil element 15b. The facing area between the first coil element 15a and the second coil element 15b is represented by R. When the area formed in the second coil element 15b is divided into S1, S2, S3, S4, S5 and S6 as will be described afterwards and as shown in FIGS. 3(a) and 3(b), the facing area R constitutes the area of S2+S3+S4 as shown in FIG. 3(a). Further, as shown in FIGS. 3(a), 3(b), 4(a), and/or 4(b), the magnetic fluxes which interlink the areas 51 through S6 in the second coil element 15b are supposed to be a magnetic flux φa1, a magnetic flux φa2, a magnetic flux φa3, a magnetic flux φa4, a magnetic flux φa5 and a magnetic flux φa6. As the first coil element 15a and the second coil element 15b overlap each other, the first coil element 15a is indicated by a bold line, the second coil element 15b by a light line, and the overlapped part of the coil elements is shifted from each other in the illustrations in FIG. 3(a) and FIG. 3(b) for the convenience of understanding. The same applies to FIG. 5 and the following drawings as well.

Now, the way of division into the areas 51 through S6 will be described.

As shown in FIG. 3(a) and FIG. 3(b), the spreading part which is parallel to the plane formed by the first coil element 15a and in which the distance of opposing by the coil line of the first coil element 15a in the direction normal to the Ma direction in which the first coil element 15a moves expands in the Ma direction is represented by Ta, and similarly the spreading part in the second coil element 15b is represented by Tb. Further in the first coil element 15a, the coil line 16 which is caused to first cross the second coil element 15b by the movement of the first coil element 15a in the Ma direction is referred to as a coil crossing part Ka, and similarly in the second coil element 15b the coil line 16 which is caused to first cross the first coil element 15a is referred to as a coil crossing part Kb.

The areas S1 and S2 are the areas into which the second coil element 15b has been divided by the spreading part Ta in the first coil element 15a.

The areas S2 and S3 are the areas into which division has been made by a line linking the point where Ta and Kb crosses each other and the point where Tb and Ka crosses each other (represented by dotted lines in FIGS. 3(a) and 3(b)) in a position where, when the first coil element 15a and the second coil element 15b are overlapped with each other, the overlapped area is the smallest in the decoupled state (the value of mutual inductance is 0 μH). Since the coil element 15a and the coil element 15b in this mode for implementation are shaped axially symmetric with respect to the Ma direction in which the coil element 15a moves, the areas S3 and S4 and the areas S4 and S5 are divided in a similar way. The positions of the line dividing the areas S2 and S3 and of the line dividing the areas S3 and S4 are fixed to the initially determined positions. Thus, even though the coil element 15a moves in the Ma direction, the distance between the line dividing the areas S2 and S3 and the line dividing the areas S3 and S4 is constant at a fixed value L.

The area S6 is an area formed by the second coil element 15b, and is the area of subtracting areas S1 to S5.

Figure 5A:
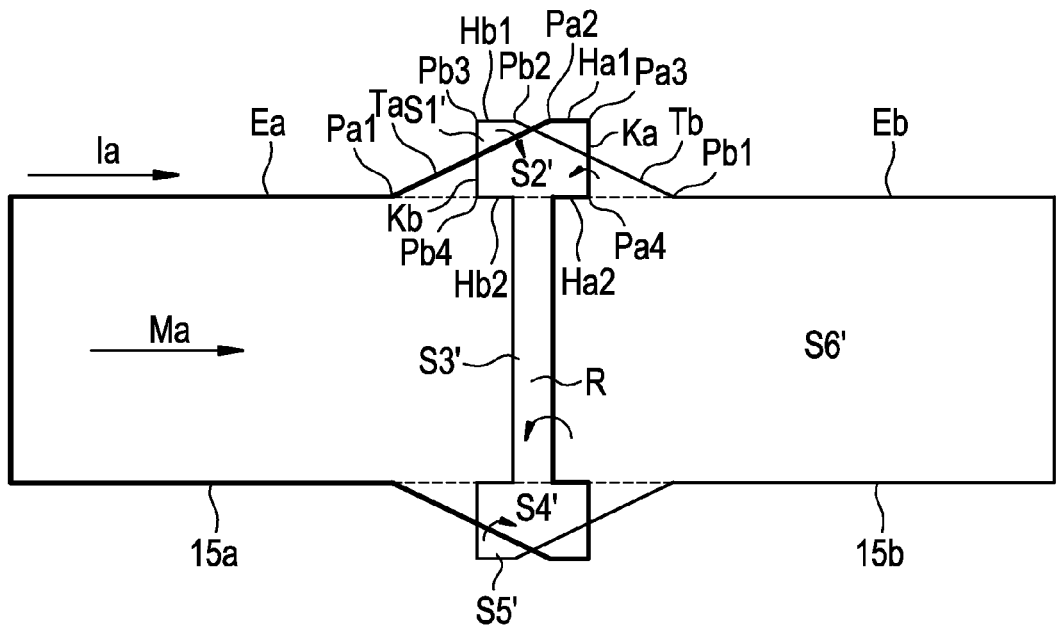
FIGS. 5(a) and 5(b) show overlapping of parts of the coil element in a mode for implementing the invention.
Figure 5B:
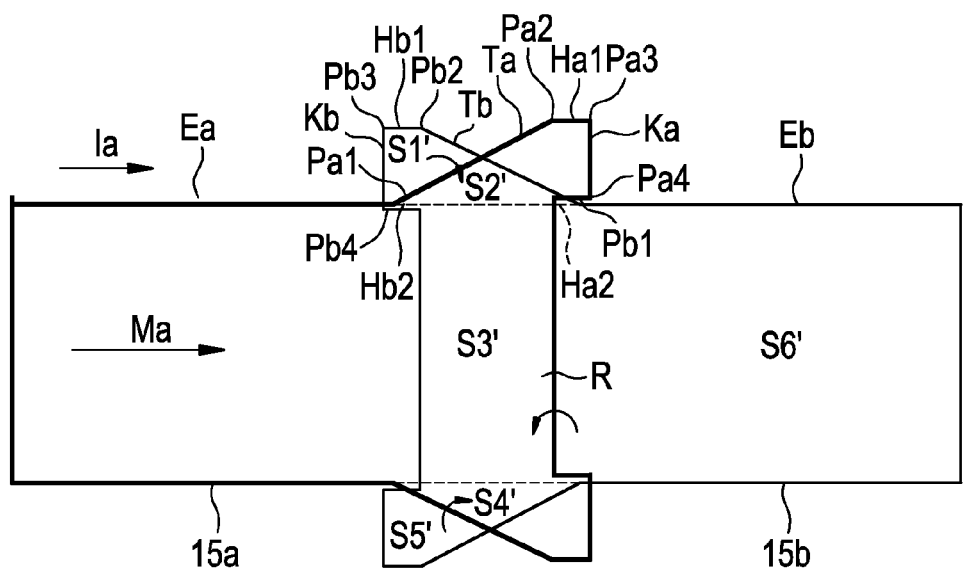

Another way of division is shown in FIGS. 5(a) and 5(b), wherein, as in the above-described way, the spreading part in the first coil element 15a is represented by Ta; the spreading part in the second coil element 15b, by Tb; a vertex in which the spreading part Ta begins to widen in the first coil element 15a, by Pa1; and a vertex in which the spreading part Tb begins to widen in the second coil element 15b, by Pb1.

The areas S1' and S2' are the areas into which the second coil element 15b has been divided by the spreading part Ta in the first coil element 15a.

The areas S2' and S3' are the areas into which the area wherein the first coil element 15a and the second coil element 15b are overlapped with each other has been divided by a line linking the vertexes Pa1 and Pb2 (represented by dotted lines in FIGS. 5(a) and 5(b)). The areas S3' and S4' and the areas S4' and S5' are divided in a similar way.

The area S6' is an area formed by the second coil element 15b and is a remainder of subtraction of the areas S1' through S5'.

Although the effect of decoupling in this mode for implementation will be described with reference to the former way of division, it can also be described similarly with reference to the latter way of division.

In order for the RF coil unit 14 to achieve a high SNR, it is necessary for each of the coil elements 15 constituting the RF coil unit 14 and the adjoining coil element 15 to be in a decoupled state. To decouple one coil element 15 from the adjoining coil element 15, it is necessary for the total sum of the magnetic fluxes φ formed by the adjoining coil element 15 which interlinks the one coil element 15 is 0 Wb and for the value of mutual inductance to be 0 μH. Even if the value of mutual inductance is not 0 μH, if its absolute value is small, a high SNR can be achieved.

With reference to FIGS. 3(a) and 3(b) for instance, in order to place the first coil element 15a and the second coil element 15b in a decoupled state, it is sufficient for the total sum of the magnetic fluxes φ formed by the first coil element 15a interlinking the second coil element 15b to be small in absolute value as stated above.

The direction of the magnetic flux φa formed by the first coil element 15a is determined by the direction of the current Ia flowing through the first coil element 15a; when the current Ia is flowing in the direction indicated by the arrow in FIG. 3(a), the direction of the magnetic fluxes interlinking the area S1 through S6 are such that, as shown in FIG. 3(a) or FIG. 4, the magnetic flux φa2, the magnetic flux φa3 and the magnetic flux φa4 are from the near to the far side, and the magnetic flux φa1, the magnetic flux φa5 and the magnetic flux φa6 are from the far to the near side, the magnetic fluxes directed from near to far being supposed to be positive and the magnetic fluxes directed from far to near, negative. It is known that, when the two coil elements are to be overlapped with each other, overlapping of around 10% of the square measures places the two coil elements in a decoupled state. Thus, there is a way of overlapping the coil elements in a decoupled state irrespective of the shape of the coil elements. Therefore, in the state shown in FIG. 3(a), the first coil element 15a and the second coil element 15b can be so overlapped as to be in a decoupled state, namely so as to make the magnetic flux interlinked with the second coil element 15b, or φa1+φa2+φa3+φa4+φa5+φa6, equal to 0 Wb.

Next, as shown in FIG. 3(b), the first coil element 15a is moved in the Ma direction to make the square measure of overlapping of the first coil element 15a and the second coil element 15b greater than in the case of FIG. 3(a). To compare the square measures of the areas S1 through S6 in the second coil element 15b then with the square measures of the respective areas in FIG. 3(a), the square measures of the areas S1, S3 and S5 increase and the square measures of the areas S2, S4 and S6 decrease. Therefore, the variation of the absolute value of the magnetic flux in each area is such that those of the magnetic flux φa1, the magnetic flux φa3 and the magnetic flux φa5 increase while those of the magnetic flux φa2, the magnetic flux φa4 and the magnetic flux φa6 decrease. In other words, among the magnetic fluxes whose direction is from near to far (positive), the magnetic flux φa3 increases while the magnetic flux φa2 and the magnetic flux φa4 decrease. Among the magnetic fluxes whose direction is from far to near (negative), the magnetic flux φ6 increases while the magnetic flux φa1 and the magnetic flux φa5 decrease. Therefore, since there are in the second coil element 15b areas in which the magnetic flux increases and areas in which the magnetic flux decreases, the increase or decrease of the magnetic fluxes φa, namely φa1+φa2+φa3+φa4+φa5+φa6, is restrained.

As described so far, since the use of the coil elements 15 according to the invention enables, even if the square measure of the overlapping parts of the coil elements 15 is varied, namely if the size of the RF coil unit 14 is varied, the increase or decrease of the magnetic fluxes which interlink the adjoining coil elements 15 to be restrained, coupling can be suppressed to keep the SNR at a high level.

Although this mode for implementing the invention has been described with reference to the coil elements 15 of the shape shown in FIG. 2, it is not limited to this shape.

In order to achieve the effect of the invention, it is sufficient for the coil elements 15 to include a shape in which the square measure of the area S2 decreases with an increase in the square measure of the area S3. In this kind of shape, inevitably the square measure of the area S1 increases while the square measure of the area S6 decreases and, regarding the increase and decrease of the magnetic fluxes interlinked with the areas, the magnetic flux φa1, the magnetic flux φa3 and the magnetic flux φa5 increase while the magnetic flux φa2, the magnetic flux φa4 and the magnetic flux φa6 decrease. Therefore, even if the square measure of the overlapping parts of the coil elements 15 is varied, namely if the size of the RF coil unit 14 is varied, the RF coil unit 14 of which the coupling is restrained and the SNR is kept at a high level can be obtained.

Further, though the coil elements 15 in this mode for implementation have two spreading parts T which are symmetric with respect to the moving direction, one spreading part may suffice. The shapes of the first coil element 15a and the second coil element 15b may either be the same or different.

Figure 6A:
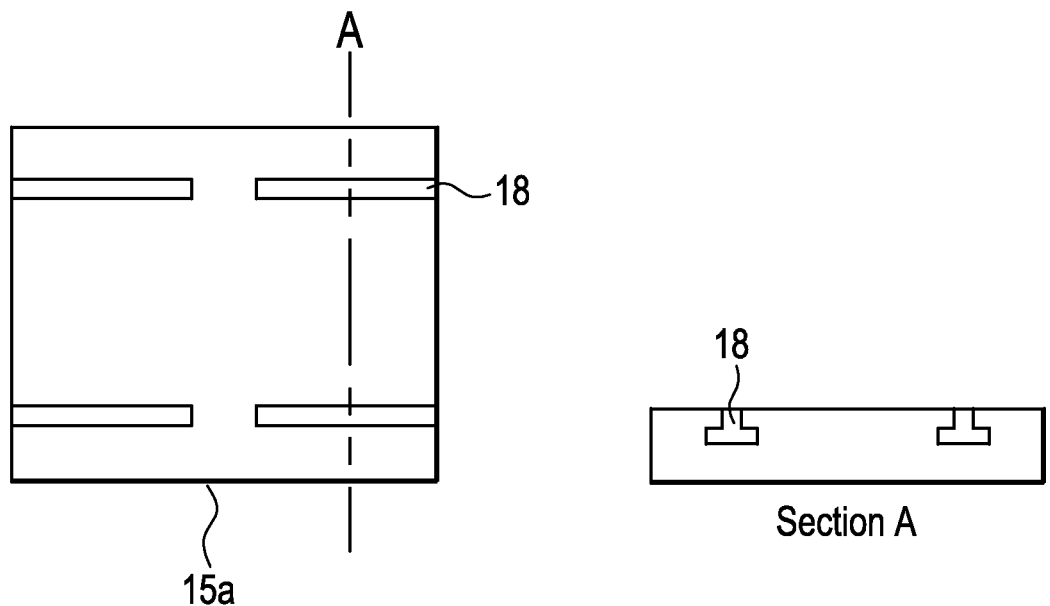
FIGS. 6(a) and 6(b) illustrate the linking and movement of the coil element in one mode for implementing the invention.
Figure 6B:
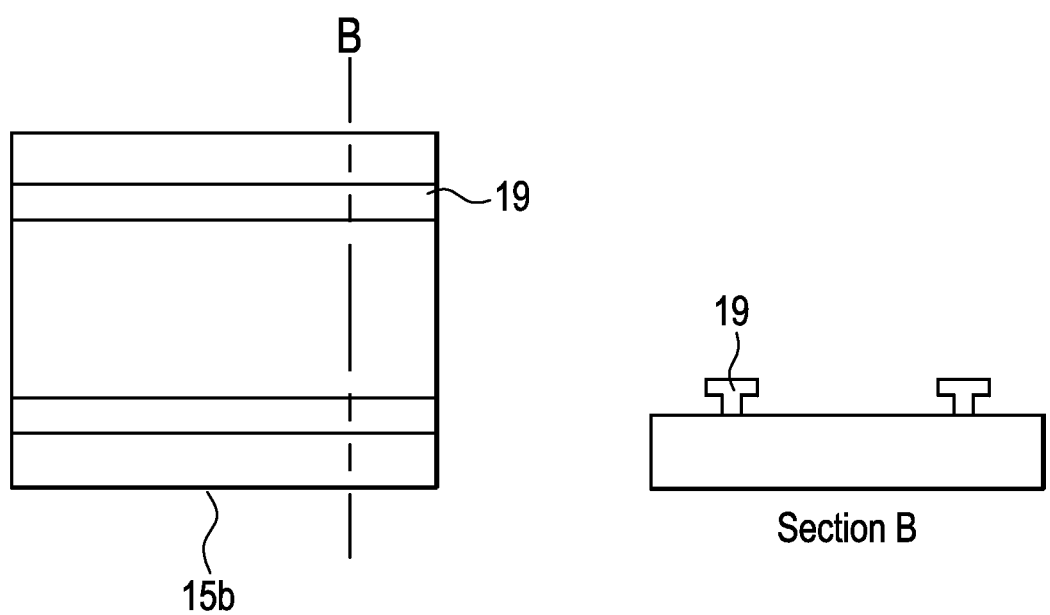

The linking and movement of the coil elements 15 in the RF coil unit 14 in one mode for implementing the invention will be described below. FIG. 6(a) and FIG. 6(b) illustrate the linking and movement of the coil elements in one mode for implementing the invention.

As shown in FIG. 6(a) and FIG. 6(b), for instance concave rails 18 are disposed in the surface of the first coil element 15a, and convexes 19 are provided on the surface of the second coil element 15b. For instance, either the first coil element 15a or the second coil element 15b may be fixed to the subject carrying unit 25 or the like. By snapping the convexes 19 into the rails 18 and causing the second coil element 15b to move on the rails 18, the square measure of overlapping of the first coil element 15a and the second coil element 15b is varied, and the size of the RF coil unit 14 varies accordingly. Therefore, the size of the RF coil unit 14 can be varied to match the subject's region to be examined or the bodily shape of the subject 40, and images can be obtained with the RF coil unit 14 being kept in close contact with the subject 40. Therefore, with the RF coil unit 14 according to the invention, a high SNR can be maintained even if the size of the RF coil unit 14 is varied.

Figure 7A:
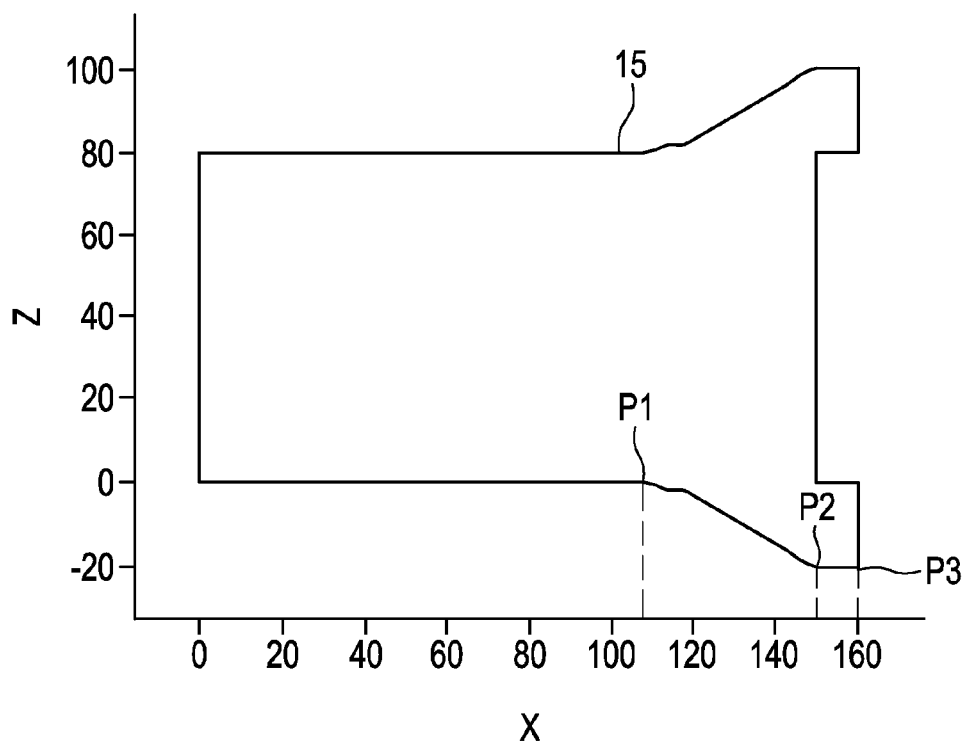
FIGS. 7(a) and 7(b) show a coil element in one mode for implementing the invention used in a simulation.
Figure 7B:
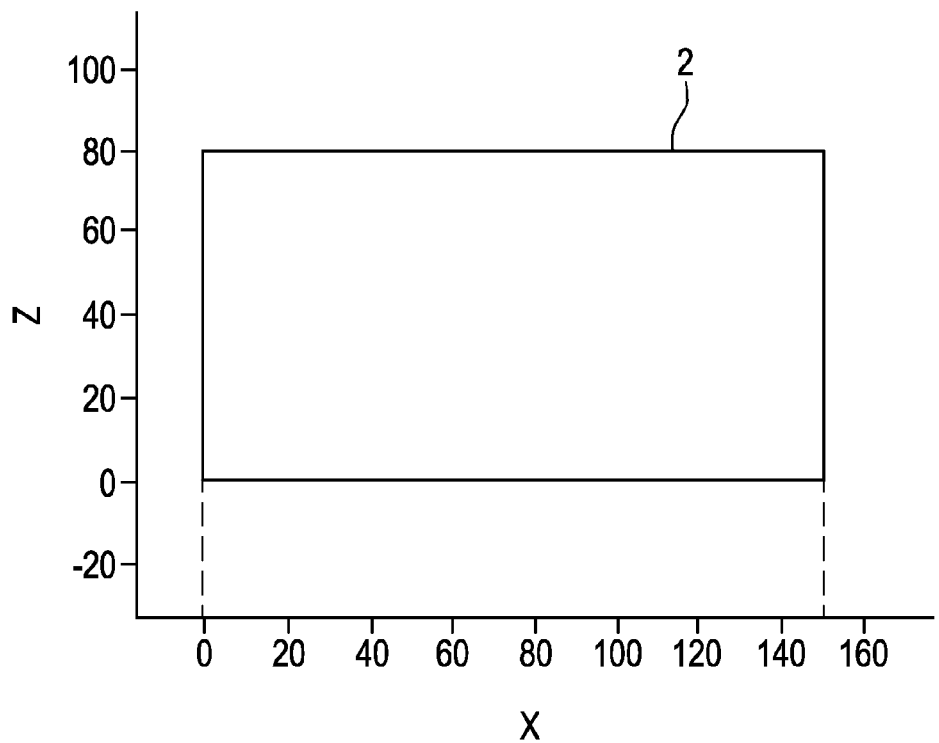

The result of simulation conducted to confirm the decoupling effect of the coil elements 15 according to the invention is shown below. FIGS. 7(a) and 7(b) show coil elements used for the simulation, wherein FIG. 7(a) shows a coil element 15 in one mode for implementing the invention and FIG. 7(b), a conventional coil element 2. The coil element 15 used in the simulation in one mode for implementing the invention, shown in FIG. 7(a), is based on a rectangle of 80 mm×150 mm, wherein P1 is located at 115 mm, P2 at 150 mm and P3 at 160 mm. The size of the conventional coil element 15 shown in FIG. 7(b) is 80 mm×150 mm.

Figure 8A:
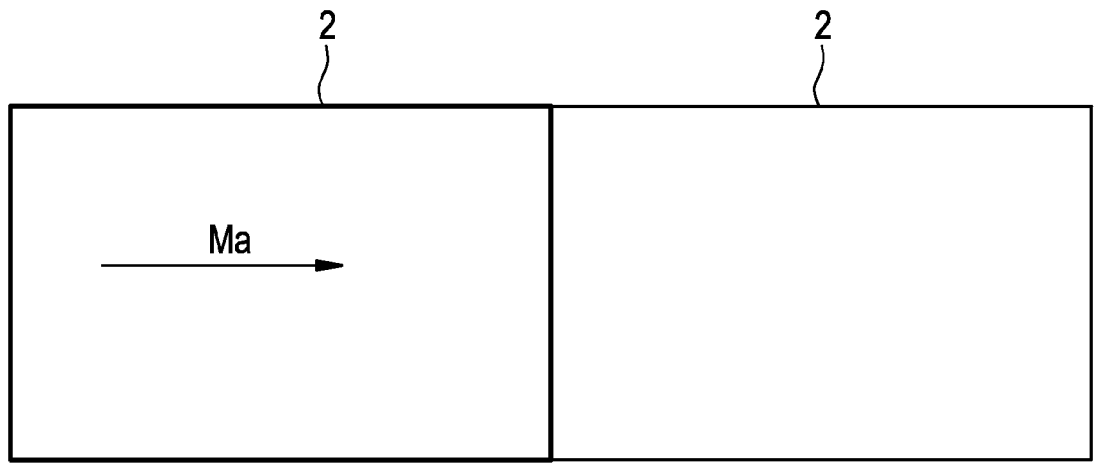
FIGS. 8(a) and 8(b) show the overlapping of the conventional coil element used in the simulation.
Figure 8B:
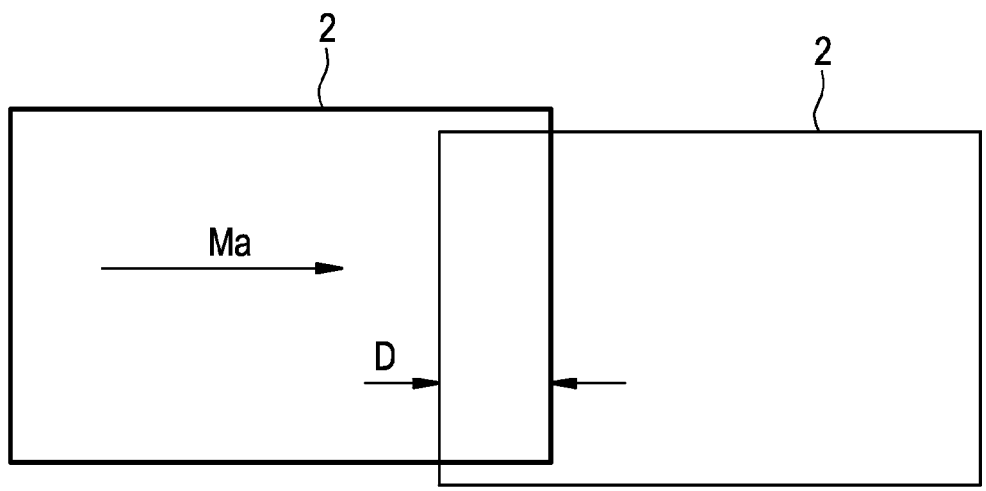

FIGS. 8(a) and 8(b) show the overlapping of the conventional coil element 2. FIG. 8(a) shows the coil elements 15 whose overlapping distance is 0 mm while FIG. 8(b) shows the coil elements 15 whose overlapping distance is 6.0 mm.

Figure 9A:
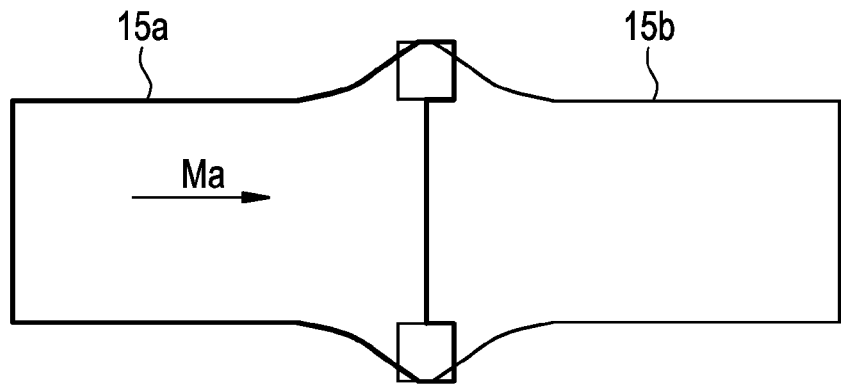
FIGS. 9(a), 9(b), and 9(c) show the overlapping of the coil element in one mode for implementing the invention, used in a simulation.
Figure 9B:
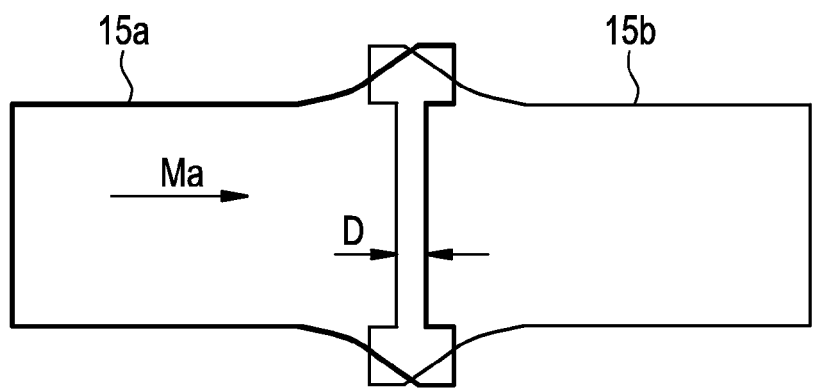
Figure 9C:
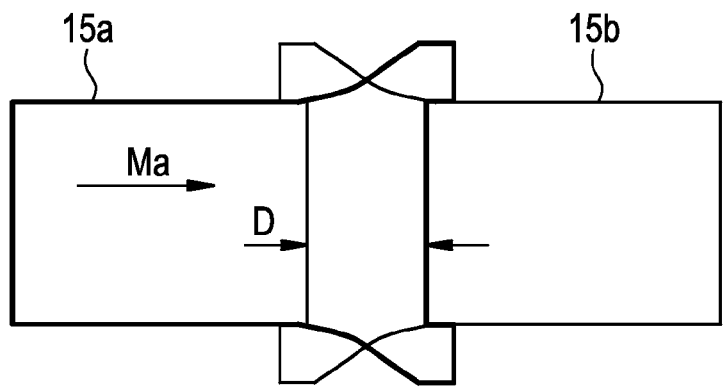

FIGS. 9(a), 9(b), and 9(c) show how the coil elements 15 in one mode for implementing the invention overlap each other. FIG. 9(a) shows the coil elements 15 whose overlapping distance is 0 mm, FIG. 9(b) shows the coil elements 15 whose overlapping distance is 5.5 mm, and FIG. 9(c) shows the coil elements 15 whose overlapping distance is 60.5 mm.

Figure 10:
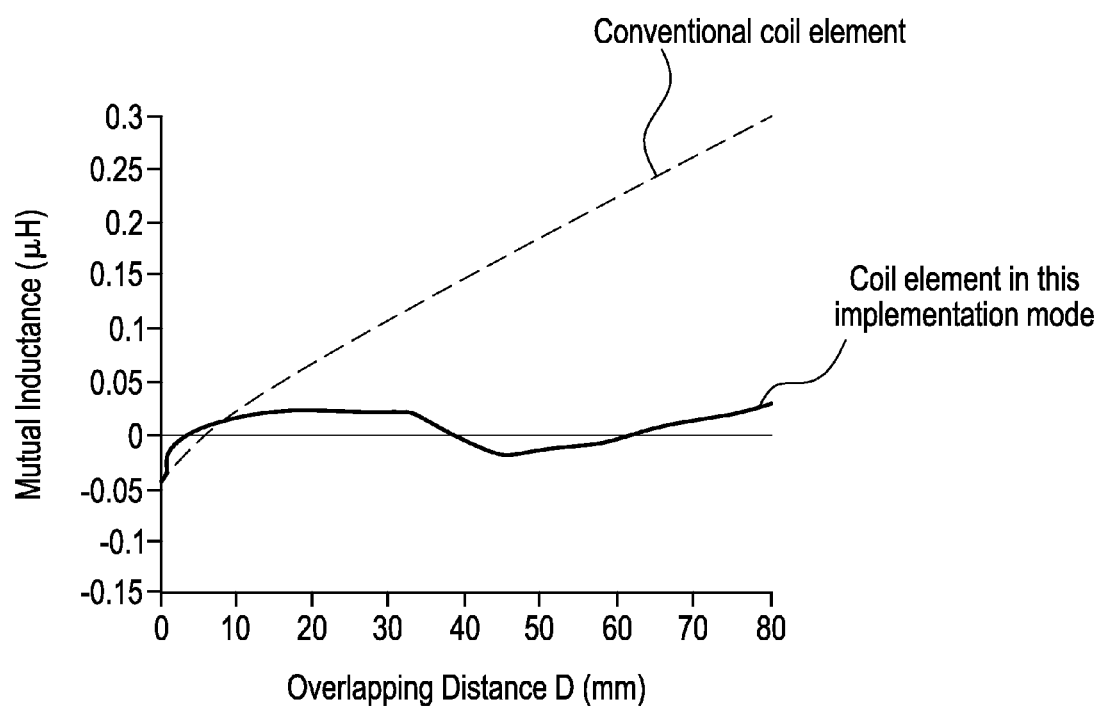
FIG. 10 shows the correlation between the overlapping distance and the mutual inductance of each coil element type.

FIG. 10 shows the correlation between the overlapping distance D and the mutual inductance of each coil element type. The dotted line represents the conventional coil elements 2 and the solid line, the coil elements 15 in one mode for implementing the invention.

First, the result of simulation using the conventional coil elements 2 will be described. Referring to FIG. 8(a), the overlapping distance of the coil elements 2 is D=0 mm. The mutual inductance then shows a negative value as indicated in FIG. 10. In this state, therefore, the coil elements 2 are in a state of being electromagnetically coupled to each other. Then, the coil elements 2 are moved in the Ma direction to bring the overlapping distance to D=6.0 mm as shown in FIG. 8(b). The mutual inductance then is 0 µH as shown in FIG. 10. The coil elements 2 then are electromagnetically decoupled from each other. It is seen that, when the overlapping distance D of the coil elements 2 is increased again, the value of the mutual inductance also increases in proportion to the overlapping distance. Thus, there is an overlapping distance D at which the conventional coil elements 2 become electromagnetically decoupled as their overlapping distance D is varied, but at other overlapping distances D, they are in an electromagnetically coupled state.

Now, the result of simulation using the coil elements 15 in one mode for implementing the invention will be described. In FIG. 9(a), the overlapping distance of the coil elements 15 is D=0 mm. The mutual inductance then shows a negative value as indicated in FIG. 10. In this state, the adjoining coil elements 15 are electromagnetically coupled to each other. Then, the coil elements 15 are moved in the Ma direction to bring the overlapping distance to D=5.5 mm as shown in FIG. 9(b). The mutual inductance then is 0 µH as shown in FIG. 10. The coil elements 15 then are electromagnetically decoupled from each other. When the overlapping distance D is increased again, the value of the mutual inductance also increases. However, the increase rate of the value of the mutual inductance is smaller than when the conventional coil elements 2 are used; after the overlapping distance D surpasses a certain value (D=15 mm in this mode for implementation), the value of the mutual inductance does not increase but remains substantially constant even if the overlapping distance D is increased. When the overlapping distance D is further increased, the value of the mutual inductance turns downward, and the overlapping distance D is increased even further to bring the overlapping distance to D=40 mm as shown in FIG. 9(c). The value of the mutual inductance then becomes 0 µH again. When the overlapping distance of the coil elements 15 continues to be further increased, the value of the mutual inductance becomes negative. However, the decrease rate of the mutual inductance is small and, when the overlapping distance of the coil elements 15 reaches a certain value (D=45 mm in this mode for implementation), the mutual inductance turns upward again, at only a small increase rate.

Therefore it is seen that, by using the coil elements 15 in one mode for implementing the invention, the range of the overlapping distance where the absolute value of the mutual inductance is small is made broader than where the conventional coil elements 2 are used. Thus, as the range of the overlapping distance where, though in an electromagnetically coupled state, the coupled state can be kept low is widened, it is seen that a high SNR can be achieved even where the RF coil unit 14 configured of the coil elements 15 according to the invention is varied.

More specifically, the range of the mutual inductance where shooting of an image would not invite significant deterioration in picture quality differs with the region to be imaged and the intensity of the main magnetic field of the magnetic resonance imaging apparatus among other factors. However, regarding the RF coil 1 using the conventional coil elements 2, it is empirically known that the overlapping distance D of the coil elements 2 allows no major deterioration of the obtained image to occur if it is about ±5 mm with reference to the overlapping distance D at which the mutual inductance becomes 0 µH. Therefore, the overlapping distance D permissible in this simulation using the conventional coil elements 2 is in the range of about 2 mm to 12 mm. The mutual inductance where the overlapping distance D is in this range is about ±0.03 µH.

In the case of the RF coil unit 14 using the coil elements 15 according to the invention, too, the range of the mutual inductance where shooting of an image would not invite significant deterioration in picture quality differs by the region to be imaged and the intensity of the main magnetic field of the magnetic resonance imaging apparatus among other factors. However, as far as the coil elements 15 according to the invention used in this simulation are concerned, the permissible range of the mutual inductance is ±0.05 µH, preferably ±0.03 µH. The permissible overlapping distance D in this simulation using the coil elements 15 according to the invention lies in the range from about 1 mm to 80 mm.

It is seen from what has been said that, where an image is shot by using the coil elements 15 in one mode for implementing the invention, the range of the overlapping distance D of coil elements in which no significant deterioration in picture quality is allowed to occur is much broader than where the conventional coil elements 2 are used.

A second mode for implementing the invention will be described in detail.

This mode for implementation is the same as the first mode for implementation except in the RF coil unit 14. For this reason, no description will be duplicated regarding similar parts.

Concerning this mode for implementation, an RF coil unit 14 having three coil elements 15 will be described.

Figure 11:
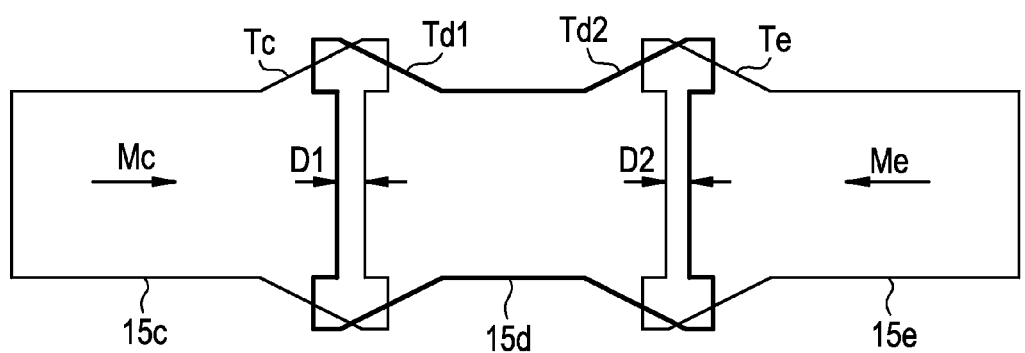
FIG. 11 shows an RF coil unit having three coil elements.
Figure 12:
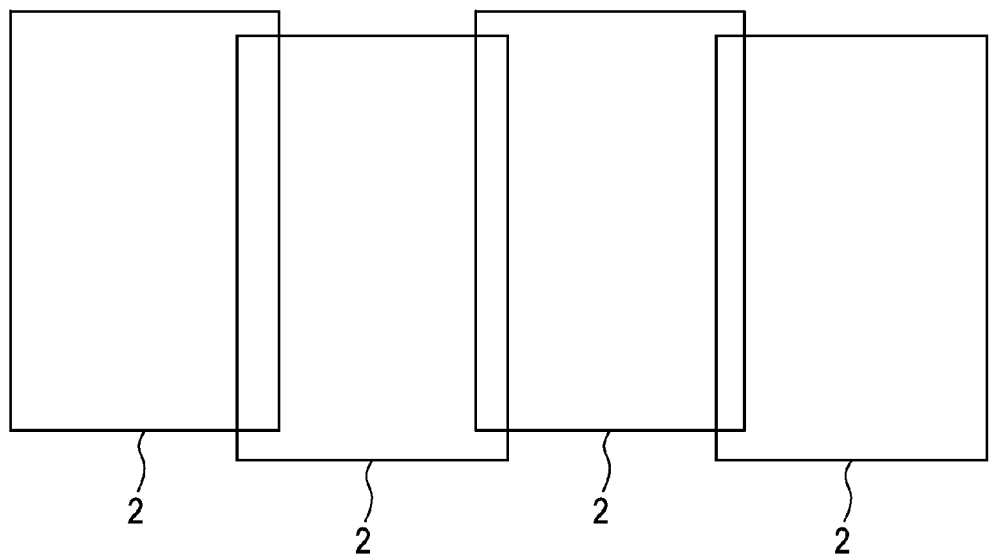
FIG. 12 is a diagram showing a conventional coil element.

FIG. 11 shows the RF coil unit 14 having three coil elements 15. In this mode for implementation, a third coil element 15c has a spreading part Tc toward a fourth coil element 15d, the fourth coil element 15d has spreading parts Td1 and Td2 on two sides, toward the third coil element 15c and a fifth coil element 15e, and the fifth coil element 15e has a spreading part Te toward the fourth coil element 15d.

The third coil element 15c moves in the Mc direction relative to the fourth coil element 15d, while the fifth coil element 15e moves in the Me direction relative to the fourth coil element 15d. They can as well move opposite to the Mc and Me directions.

In the case of the RF coil unit 14 in this mode for implementation, when for instance the overlapping distance D1 of the third coil element 15c and the fourth coil element 15d is in the state shown in FIG. 11, if the value of the mutual inductance between the third coil element 15c and the fourth coil element 15d is 0 µH, the absolute value of the mutual inductance between the third coil element 15c and the fourth coil element 15d can be kept small even if the third coil element 15c is moved in the Mc direction. Similarly, the absolute value of the mutual inductance between the fifth coil element 15e and the fourth coil element 15d can be kept small even if the fifth coil element 15e is moved in the Me direction to an overlapping distance D1 of the fifth coil element 15e and the fourth coil element 15d. Therefore, the coupled state between the third coil element 15c and the fourth coil element 15d can be kept low, and the coupled state between the fourth coil element 15d and the fifth coil element 15e can also be kept low. Accordingly, where the RF coil unit 14 in this mode for implementation is used, even if the size of the RF coil unit 14 is varied to match the subject's region to be examined or the bodily shape of the subject 40, images of a high SNR and of high picture quality can be obtained. Incidentally, though the RF coil unit 14 in this mode for implementation is configured of three coil elements 15, the number of coil elements is not limited to this. If there is any coil element 15 overlapping another coil element 15 then, the overlapping part in each coil element 15 will have a spreading part T.

To add, the first coil element 15a in the mode for implementation described above corresponds to the first loop coil element according to the invention. Alternatively, the second coil element 15b in this mode for implementation corresponds to the second loop coil element according to the invention.

Implementation of the invention is not limited to the modes described above, but various modified modes can be adopted.

Although the RF coil unit 14 has been described with reference to an RF coil unit 14 as a magnetic resonance imaging apparatus, the RF coil unit 14 according to the invention is applicable not only to magnetic resonance imaging apparatuses but also to apparatuses in which coil elements 15 constituting an RF coil unit 14 are used in an electromagnetically decoupled state. Though the first mode for implementation uses an RF coil unit 14 having two coil elements 15 and the second mode for implementation uses an RF coil unit 14 having three coil elements 15, the number of coil elements 15 that an RF coil unit 14 can have is not restricted.

Many widely different embodiments of the invention may be configured without departing from the spirit and the scope of the present invention. It should be understood that the present invention is not limited to the specific embodiments described in the specification, except as defined in the appended claims.

The invention claimed is:

1. An RF coil comprising:
    a first loop coil element including a first plane closed by a first coil line; and
    a second loop coil element including a second plane closed by a second coil line, wherein at least a portion of said first plane and at least a portion of said second plane face each other, such that said first loop coil element and said second loop coil element are each configured to move while maintaining a facing state as to vary a square measure of a facing area in which said first coil plane and said second coil plane face each other,
    said first loop coil element comprising:
        a first spreading part having a first coil line disposed such that a distance of opposing by said first coil line parallel to a first moving direction widens in said first moving direction, in a direction normal to said first moving direction in which the movement so takes place that the square measure of said facing area increases relative to said second loop coil element in a direction parallel to said first plane; and
        a first coil crossing part in which a first coil line is so disposed as to cross a second spreading part in an arrangement in which said first loop coil element and said second loop coil element are electromagnetically decoupled and the square measure of said facing area is at a minimum thereof,
    said second loop coil element comprising:
        a second spreading part having a second coil line disposed such that a distance of opposing by said second coil line parallel to a second moving direction widens in said second moving direction, in a direction normal to said second moving direction in which the movement so takes place that the square measure of said facing area increases relative to said first loop coil element in a direction parallel to said second plane; and
        a second coil crossing part in which a second coil line is disposed as to cross said first spreading part in said arrangement,
    wherein said first loop coil element and said second loop coil element are formed such that, when in said arrangement said facing area has been separated into a first facing area and a second facing area by a line linking a point at which said first spreading part and said second coil crossing part cross each other and a point at which said second spreading part and said first coil crossing part cross each other, the square measure of said second facing area decreases as movement takes place to increase the square measure of said first facing area.

2. The RF coil according to claim 1, wherein a range in which said first loop coil element moves relative to said second loop coil element is a range in which said first loop coil element and said second loop coil element maintain a decoupled state electromagnetically.

3. The RF coil according to claim 1, wherein:
    said first loop coil element further comprises a first extending part extending from an end on a side where said first coil line begins to widen outward in said first spreading part; and
    said second loop coil element further comprises a second extending part extending from an end on a side where said second coil line begins to widen outward in said second spreading part.

4. The RF coil according to claim 2, wherein:
    said first loop coil element further comprises a first extending part extending from an end on a side where said first coil line begins to widen outward in said first spreading part; and
    said second loop coil element further comprises a second extending part extending from an end on a side where said second coil line begins to widen outward in said second spreading part.

5. The RF coil according to claim 3, wherein:
    said first extending part extends in a direction opposite to said first moving direction; and
    said second extending part extends in a direction opposite to said second moving direction.

6. The RF coil according to claim 3, wherein:
    said first loop coil element further comprises:
        a first parallel part extending in a direction parallel to said first moving direction from an end part on a side where said first coil line begins to narrow inward in said first spreading part as to join an end part of said first coil crossing part; and
        another a second parallel part extending in the direction parallel to said first moving direction from an end part different from said end part of said first coil crossing part in a direction opposite to said first moving direction; and
    said second loop coil element further comprises:

a third parallel part extending in a direction parallel to said second moving direction from the end part on a side where said second coil line begins to narrow inward in said second spreading part to join an end part of said second coil crossing part; and
a fourth parallel part extending in the direction parallel to said second moving direction from an end part different from said end part of said second coil crossing part in a direction opposite to said second moving direction.

7. The RF coil according to claim 1, wherein:
at least one of said first loop coil element and said second loop coil element is axially symmetric with respect to said first moving direction.

8. The RF coil according to claim 1, wherein
at least one of said first loop coil element and said second loop coil element is axially symmetric with respect to the direction normal to said first moving direction.

9. The RF coil according to claim 1, wherein:
a shape of said first loop coil element and a shape of said second loop coil element differ from each other.

10. The RF coil according to claim 1, wherein:
a shape of said first loop coil element and a shape of said second loop coil element are the same.

11. The RF coil according to claim 1, wherein, in a magnetic resonance imaging apparatus configured to obtain an image of a subject on the basis of magnetic resonance signals deriving from the subject in a magnetostatic space, said RF coil is configured to at least one of transmit the magnetic resonance signals and receive the magnetic resonance signals.

12. A magnetic resonance imaging apparatus having an RF coil configured to at least one of transmit magnetic resonance signals and receive magnetic resonance signals, said RF coil comprising:
a first loop coil element including a first plane closed by a first coil line; and
a second loop coil element including a second plane closed by a second coil line, wherein at least a portion of said first plane and at least a portion of said second plane face each other such that said first loop coil element and said second loop coil element are configured to move while maintaining a facing state to vary a square measure of a facing area in which said first coil plane and said second coil plane face each other,
said first loop coil element comprising:
a first spreading part having a first coil line disposed such that a distance of opposing by said first coil line parallel to a first moving direction widens in said first moving direction, in a direction normal to said first moving direction in which the movement so takes place that the square measure of said facing area increases relative to said second loop coil element in a direction parallel to said first plane; and
a first coil crossing part in which a first coil line is disposed as to cross a second spreading part in an arrangement in which said first loop coil element and said second loop coil element are electromagnetically decoupled and the square measure of said facing area is at a minimum thereof,
said second loop coil element comprising:
a second spreading part having a second coil line disposed such that a distance of opposing by said second coil line parallel to a second moving direction widens in said second moving direction, in a direction normal to said second moving direction in which the movement so takes place that the square measure of said facing area increases relative to said first loop coil element in a direction parallel to said second plane; and
a second coil crossing part in which a second coil line is so disposed as to cross said first spreading part in said arrangement,
wherein said first loop coil element and said second loop coil element are formed such that, when in said arrangement said facing area has been separated into a first facing area and a second facing area by a line linking a point at which said first spreading part and said second coil crossing part cross each other and a point at which said second spreading part and said first coil crossing part cross each other, the square measure of said second facing area decreases as movement takes place to increase the square measure of said first facing area.

13. The magnetic resonance imaging apparatus according to claim 12, wherein:
a range in which said first loop coil element moves relative to said second loop coil element is a range in which said first loop coil element and said second loop coil element maintain a decoupled state electromagnetically.

14. The magnetic resonance imaging apparatus according to claim 12, wherein:
said first loop coil element further comprises a first extending part extending from an end on a side where said first coil line begins to widen outward in said first spreading part; and
said second loop coil element further comprises a second extending part extending from an end on a side where said second coil line begins to widen outward in said second spreading part.

15. The magnetic resonance imaging apparatus according to claim 12, wherein:
said first extending part extends in a direction opposite to said first moving direction; and
said second extending part extends in a direction opposite to said second moving direction.

16. The magnetic resonance imaging apparatus according to claim 14, wherein:
said first loop coil element further comprises:
a first parallel part extending in a direction parallel to said first moving direction from an end part on a side where said first coil line begins to narrow inward in said first spreading part as to join an end part of said first coil crossing part; and
another a second parallel part extending in the direction parallel to said first moving direction from an end part different from said end part of said first coil crossing part in a direction opposite to said first moving direction; and
said second loop coil element further comprises:
a third parallel part extending in a direction parallel to said second moving direction from an end part on a side where said second coil line begins to narrow inward in said second spreading part to join an end part of said second coil crossing part; and
a fourth parallel part extending in the direction parallel to said second moving direction from an end part different from said end part of said second coil crossing part in a direction opposite to said second moving direction.

17. The magnetic resonance imaging apparatus according to claim 12, wherein:
at least one of said first loop coil element and said second loop coil element is axially symmetric with respect to said first moving direction.

18. The magnetic resonance imaging apparatus according to claim 12, wherein:

at least one of said first loop coil element and said second loop coil element is axially symmetric with respect to the direction normal to said first moving direction.

19. The magnetic resonance imaging apparatus according to claim 12, wherein:

the shape of said first loop coil element and the shape of said second loop coil element in said RF coil differ from each other.

20. The magnetic resonance imaging apparatus according to claim 12, wherein:

the shape of said first loop coil element and the shape of said second loop coil element in said RF coil are the same.

* * * * *